(12) United States Patent
Granada et al.

(10) Patent No.: US 6,661,082 B1
(45) Date of Patent: Dec. 9, 2003

(54) FLIP CHIP SUBSTRATE DESIGN

(75) Inventors: Honorio T. Granada, Cebu (PH); Rajeev Joshi, Cupertino, CA (US); Connie Tangpuz, Lapulapu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/619,115

(22) Filed: Jul. 19, 2000

(51) Int. Cl.[7] ............................................. H01L 23/495
(52) U.S. Cl. ...................... 257/676; 257/738; 257/778; 257/713; 228/180.22
(58) Field of Search ................................ 257/738, 778, 257/713, 676, 690, 780, 782, 207, 287, 341, 401, 737, 666–677; 438/613–617, 111, 123, FOR 366, FOR 377, FOR 380; 228/180.22

(56) References Cited

U.S. PATENT DOCUMENTS 5,629,835 A * 5/1997 Mahulikar et al. .......... 361/719
6,329,713 B1 * 12/2001 Farquhar et al. ............ 257/712

* cited by examiner

*Primary Examiner*—Tom Thomas
*Assistant Examiner*—Douglas W. Owens
(74) *Attorney, Agent, or Firm*—Townsend and Townsend and Crew LLP

(57) ABSTRACT

A chip device that includes a leadframe that has a die attach cavity. The memory device further includes a die that is placed within the die attach cavity. The die attach cavity is substantially the same thickness as the die. The die is positioned within the cavity and is attached therein with a standard die attachment procedure.

8 Claims, 2 Drawing Sheets

FLIP CHIP SUBSTRATE DESIGN

BACKGROUND OF THE INVENTION

1. Field of the Invention

The present invention relates to a chip device, and more particularly, to discrete power components such as MOSFETs, as well as ICs such as memory circuits that include a leadframe that includes a cavity for receiving the die.

2. Description of the Prior Art

Chip devices generally include a leadframe and a bumped die attached thereto. Many of the packages are multiple pieces and rely on wire bonding as the interconnect between the die and the package. Additionally, many BGA (ball grid array) substrates do not have the capability for solder balls to be pre-attached or for a cavity to be milled in the substrate to facilitate die attach.

These prior art packages limit the ability to form thin packages. Additionally, the manufacturing processes for these devices are inefficient.

SUMMARY OF THE INVENTION

The present invention provides a chip device that includes a die and a leadframe. The leadframe includes a die attach cavity. The die attach cavity is substantially the same thickness as the die. The die is positioned within the cavity and is attached therein with a standard die attachment procedure.

In accordance with one aspect of the present invention, a plurality of dimples is defined around the periphery of the leadframe the receives solder balls.

In accordance with another aspect of the present invention, the leadframe consists of a copper based alloy.

In accordance with a further aspect of the present invention, the leadframe includes a solderable coating.

The present invention also provides a method of making a memory device. The method includes providing a die and providing a leadframe that includes a die attach cavity. The leadframe includes a plurality of dimples defined around a periphery of the Leadframe. The die attach cavity has substantially the same thickness as the die. Solder balls are placed into the dimples. The die is flipped into the die attach cavity.

The resulting chip device has enhanced thermal performance since heat is dissipated from the face of the die (where it is generated) as well as from the bottom of the die due to its contact with the leadframe structure. The memory device also has a thinner package comparable to TSSOP stand-off, which is the current trend for miniaturization. The manufacturing process is simplified when compared to conventional assembly processes by eliminating such steps as wire bonding, molding, forming and plating.

Other features and advantages of the present invention will be understood upon reading and understanding the detailed description of the preferred exemplary embodiments, found hereinbelow in conjunction with reference to the drawings in which like numerals represent like elements.

DETAILED DESCRIPTION OF THE PREFERRED EXEMPLARY EMBODIMENTS

Figure 1:
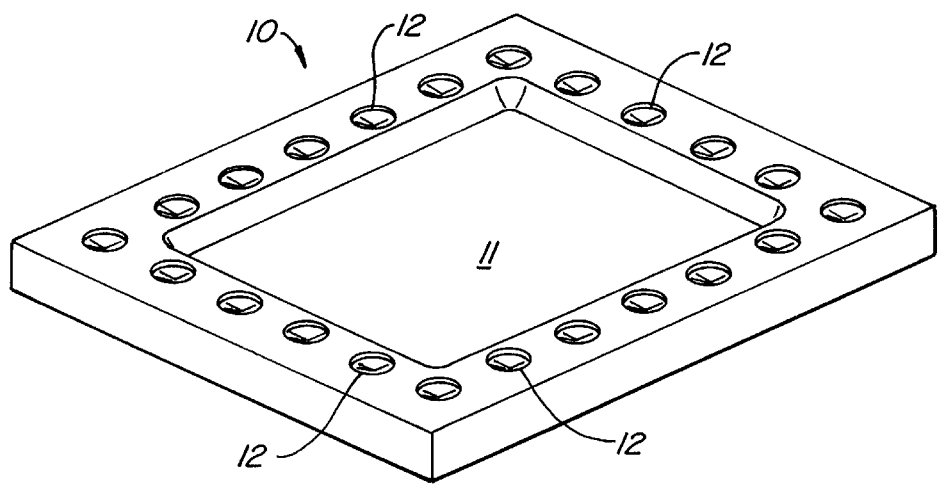
FIG. 1 is a perspective view of a flip chip leadframe in accordance with the present invention.

FIG. 1 illustrates a leadframe 10 for use in manufacturing a chip device in accordance with the present invention. The leadframe includes a die attach cavity 11 defined within the leadframe. In a preferred embodiment, a plurality of dimples 12 are defined around the periphery of the leadframe.

Figure 2:
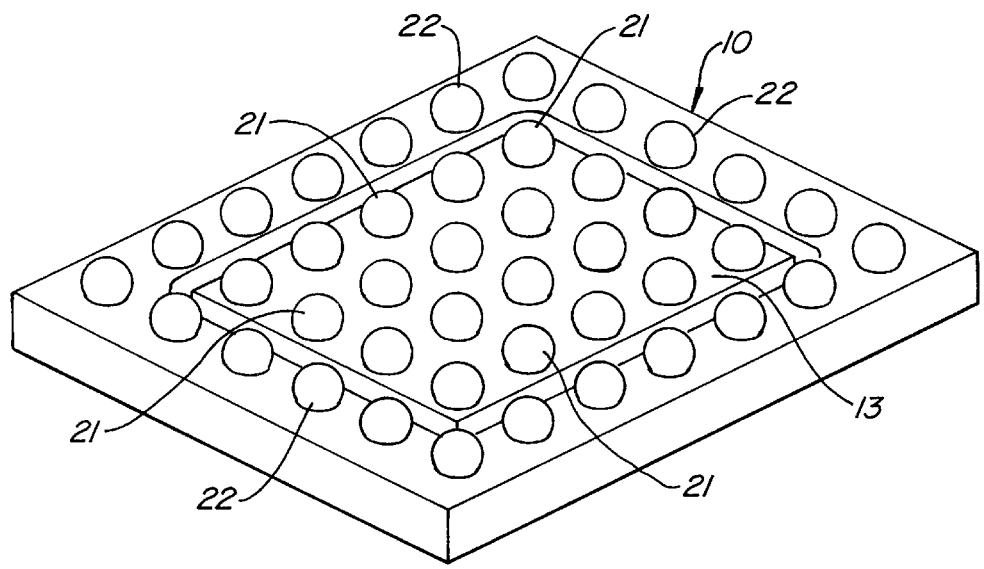
FIG. 2 is a perspective view of the flip chip leadframe illustrated in FIG. 1 including solder balls and the die.
Figure 3:
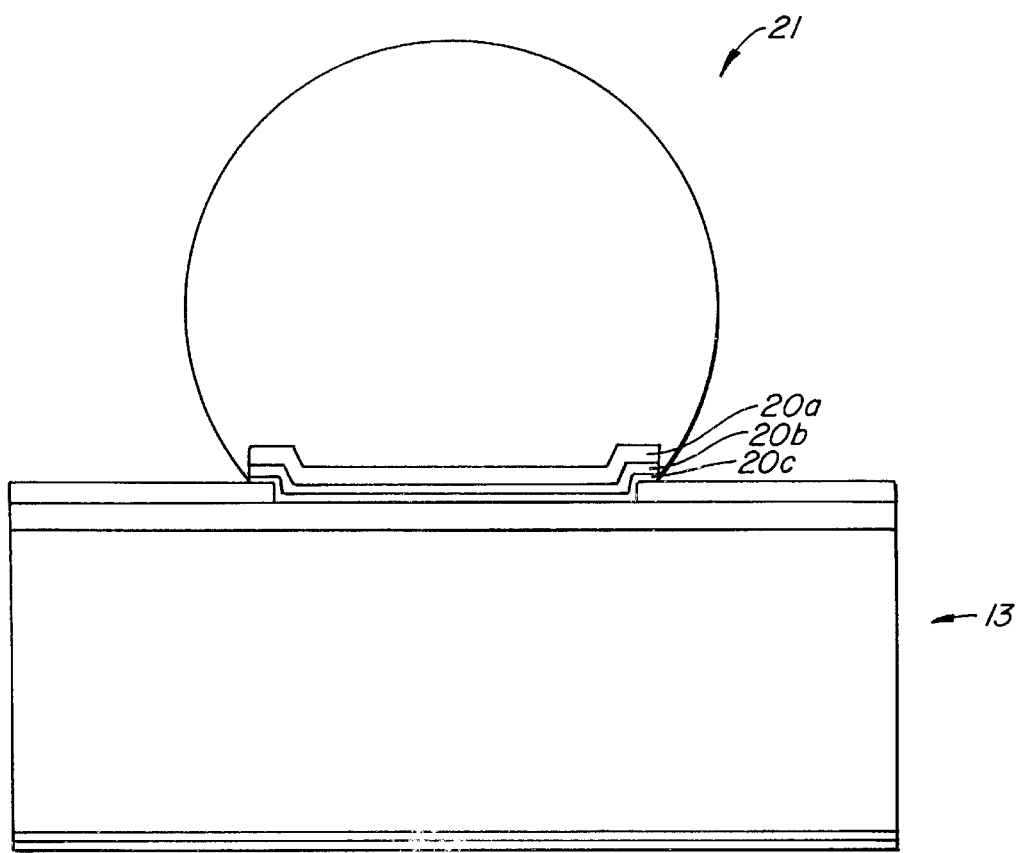
FIG. 3 is a schematic side view of a bumped die.

As can be seen in FIG. 2, a die 13 is placed within the cavity to complete the chip device. Die 13 is preferably a one-piece item that is often referred to in the art as a "bumped die." As can be seen in FIG. 3, a bumped die includes die 13, "under bump material" that serves as an intermediate layer 20 between the top surface of the die and solder bump 21, and the solder bumps themselves. Preferably, the under bump material is one of TiW, Cu, Au or an equivalent. In the example illustrated in FIG. 3, the under bump material is broken into three layers—Cu plating 20a, sputtered Cu 20b and sputtered Ti 20d.

The die attach pad area is etched out such that the depth of the cavity is the same as the die thickness. Preferably, the leadframe consists of a material made of thermally and electrically conductive metal alloy such as, for example, copper based Eftec 3S. Additionally, in a preferred embodiment, the leadframe is coated with a solderable coating such as Ni:Pd.

Solder balls 22 are placed within the dimples. These solder balls serve as the connection for the drain region of the die since the leadframe is conductive. Solder bumps 21 serve as the connections for the source and gate regions.

The reverse side of the leadframe may be marked with the product code and other manufacturing codes, either at the leadframe fabricator's end or during assembly of the IC packages.

As a result of this structure, a bumped die may be die attached into the leadframe cavity using conventional die attach processes. The solder balls on the bumped die form (both in the cavity and the dimples) the source and gate connections to the PCB with the solder balls on the leadframe forming the drain connections.

Thus, the present invention provides an improved chip device, such as a MOSFET BGA, that has improved thermal performance. The improved thermal performance is due to the fact that heat is dissipated from the face of the die (where it is generated) as well as from the bottom of the die due to its contact with the leadframe structure. Additionally, the present invention provides a chip device that results in a thinner package (generally less than 1 millimeter) comparable to TSSOP stand-off, which is the current trend for miniaturization. The manufacturing process is also simplified since solder ball attach of the leads of the leadframe have been eliminated and conventional assembly process steps, such as wire bonding, molding, forming and plating, have also been eliminated.

Although the invention has been described with reference to specific exemplary embodiments, it will appreciated that it is intended to cover all modifications and equivalents within the scope of the appended claims.

What is claimed is:

1. A discrete power chip device comprising:
   a. a die including a plurality of solder balls thereon that serve as source and gate connections; and
   b. a conductive leadframe including a die attach cavity, the die attach cavity having substantially the same thickness as the die;

wherein the die is positioned within the die attach cavity and is attached thereon such that the die is coplanar with a top surface of the leadframe;

wherein a plurality of solder balls are placed on the top surface around the entire periphery of the leadframe that serve as drain connections; and wherein the device has improved thermal resistance and reduced electrical path resistance.

2. The chip device of claim 1 further comprising a plurality of dimples defined around the periphery of the leadframe within the top surface that receive the solder balls.

3. The chip device of claim 1 wherein the leadframe consists of a copper based alloy.

4. The chip device of claim 3 wherein the leadframe includes a solderable coating.

5. The chip device of claim 1 wherein the die is a bumped die.

6. A discrete power chip device comprising:

a. a bumped die, wherein the solder bumps serve as gate and source connections;

b. a conductive leadframe including a die attach cavity and a plurality of dimples defined around the entire periphery of the leadframe within a top surface of the leadframe, the die attach cavity having substantially the same thickness as the die; and c. a plurality of solder balls placed within the dimples that serve as drain connections;

wherein the die is positioned within the cavity and is attached thereon such that the die is coplanar with the top surface of the leadfame; and wherein the device has improved thermal resistance and reduced electrical path resistance.

7. The chip device of claim 6 wherein the leadframe consists of a copper based alloy.

8. The chip device of claim 7 wherein the leadframe includes a solderable coating.

* * * * *